(12) United States Patent
Bae

(10) Patent No.: US 6,698,001 B2
(45) Date of Patent: Feb. 24, 2004

(54) METHOD FOR GENERATING REGISTER TRANSFER LEVEL CODE

(75) Inventor: Jong-Hong Bae, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/227,165

(22) Filed: Aug. 23, 2002

(65) Prior Publication Data

US 2003/0121009 A1 Jun. 26, 2003

(30) Foreign Application Priority Data

Dec. 24, 2001 (KR) ................................ 10-2001-0084448

(51) Int. Cl.[7] ............................................. G06F 17/50
(52) U.S. Cl. ....................... 716/3; 716/1; 716/2; 716/6; 716/18; 703/15; 703/22
(58) Field of Search ................. 716/2, 1, 6, 18; 714/726; 703/22, 19, 15, 1, 13; 700/98; 327/215; 326/59

(56) References Cited

U.S. PATENT DOCUMENTS

2001/0011212 A1 * 8/2001 Raynaud et al. ............. 703/22
2002/0174409 A1 * 11/2002 Cohn et al. ................... 716/6
2003/0061573 A1 * 3/2003 Tsuchiya ....................... 716/1

FOREIGN PATENT DOCUMENTS

KR     2000-41368     7/2000     .......... H03K/19/00

* cited by examiner

*Primary Examiner*—Vuthe Siek
*Assistant Examiner*—Helen Rossoshek
(74) *Attorney, Agent, or Firm*—Jacobson Holman PLLC

(57) ABSTRACT

A method for generating a register transfer level code, comprising the steps of: generating the generalized register transfer level code without considering process conditions; separating all logic gates into either a combinational logic circuit or a sequential logic circuit; transforming the register transfer level code of the separated combinational logic circuits and sequential logic circuits into each equivalent register transfer level code; and simplifying the combinational logic circuits and the sequential logic circuits into one simple code.

8 Claims, 5 Drawing Sheets

FIG. 4B

```
AND02 and2_0 (.I1(A), .I2(B), .O1(E));
AND02 and2_1 (.I1(C), .I2(D_L1), .O1(F));
OR02 or2_0 (.I1(E), .I2(F), .O1(O1_T));
DFF dff_0 (.clk(CLK1), .D(D), .Q(D_L1));
TRB1trb1_1 (.OE(O1_OE), .I(O1_T), .O(O1));
```

FIG. 4C

```
C/L:
AND02 and2_0 (.I1(A), .I2(B), .O1(E));
AND02 and2_1 (.I1(C), .I2(D_L1), .O1(F));
OR02 or2_0 (.I1(E), .I2(F), .O1(O1_T));
Reg/Tri:
DFF dff_0 (.clk(CLK1), .D(D), .Q(D_L1));
TRB1trb1_1 (.OE(O1_OE), .I(O1_T), .O(O1));
```

FIG. 4D

```
C/L:
assign E=A&B;
assign F=C&D_L1;
assign O1_T=E|F;
Reg/Tri:
DFF dff_0 (.clk(CLK1), .D(D), .Q(D_L1));
TRB1trb1_1 (.OE(O1_OE), .I(O1_T), .O(O1));
```

FIG. 4E

```
C/L:
assign O1_T=(A&B)| (C&D L1);
Reg/Tri:
DFF dff_0 (.clk(CLK1), .D(D), .Q(D_L1));
TRB1trb1_1 (.OE(O1_OE), .I(O1_T), .O(O1));
```

FIG. 4F

```
C/L:
assign O1_T=(A&B)| (C&D L1);
Reg/Tri:
always (posedge CLK1)
if (CLK1)D_L1 <=D;
assign O1=O1_OE?O1_T:1'bz;
```

FIG. 4G

```
assign O1_T=(A&B) (C&D L1);
always (posedge CLK1)
if (CLK1)D_L1 <=D;
assign O1=O1_OE?O1_T:1'bz;
```

METHOD FOR GENERATING REGISTER TRANSFER LEVEL CODE

FIELD OF THE INVENTION

The present invention relates to a method for generating a register transfer level (RTL) code for a very large scale integrated circuit VLSI design.

DESCRIPTION OF THE RELATED ART

Generally, numerous logic circuits are integrated into a single chip by a very large scale integrated circuit VLSI technology. Due to the increased number of logic circuits comprising the highly integrated circuit, however, each logic circuit cannot be designed separately by programmers. Therefore, a timing delay in each logic circuit and a timing error can be occur when numerous logic circuits are integrated in a short period of time.

In order to solve the above problem, a RTL code, which can change process conditions of each logic circuit consisting of the VLSI, is introduced. However, if the number of logic circuits comprising the VLSI is increased, the length of the RTL code is increased, which reduces the recognition of the RTL code. Therefore, this method is not the proper solution as is the case with core logic.

FIG. 1 is a general circuit diagram of a method for generating an ordinary RTL code in accordance with the present invention.

Referring to FIG. 1, the circuit includes two AND gates 10 and 20, an OR gate 30, a D flip-flop 40 and a three-state buffer 050. The circuit in FIG. 1 can be described in RTL as shown in Table 1. The first AND gate 10 is expressed as (a) in Table 1 so that an AND gate AND02D1, which is verified in a certain process condition, is used by the first AND gate 10. Herein, signals A and B are inputted to the first AND gate 10 and a signal E is outputted from the first AND gate 10. The second AND gate 20 is expressed as (b) in Table 1 so that an AND gate AND02D2, which is verified in a certain process condition, is used by the second AND gate 20. Herein, signals C and D_L1 are inputted to the second AND gate 20 and a signal F is outputted from the second AND gate 20.

The terms "and2_0" and "and2_1" in Table 1 are called "instance" and they are expressions for distinguishing each AND gate. That is, designing the VLSI by the instance distinguishes the first and second AND gates and2_0 and and2_1.

The D flip-flop 40 is described as (c) in Table 1. The D flip-flop 40 receives a signal D and a clock signal CLK1 and outputs the signal D_L1, which is a signal D synchronized with the clock CLK1. In the OR gate 30, a verified device OR02D2 is employed as the tool for designing the VLSI and signals E and F are inputted thereto and a signal 01_T is outputted. The three-state buffer 50 is described as (e) in Table 1 and the signal O1_T is inputted thereto and a signal O1 is output ed. The three-state buffer 50 is controlled by an enable signal O1_E.

In the OR gate 30, a verified device OR02D2 is employed as the tool for designing the VLSI so that E and F become input terminals and "O1_T" becomes an output terminal.

The three-state buffer 50 is described as (e) in Table 1 so that "O1_OE" becomes an input terminal and "O1_T" becomes an output terminal. At this point, the three-state buffer 50 is controlled by a signal applied from a terminal O1 in order to output an output signal.

TABLE 1

| | |
|---|---|
| (a) | AND02D1 and2_0(.A1(A), .A2(B), .Z(E)); |
| (b) | AND02D2 and2_1(.A1(C), .A2(D), .Z(F)); |
| (c) | DFF dff_0(.clk(CLK1), .D(D), .Q(D_L1)); |
| (d) | OR02D1 or2_0 (.A1(E), A2(F), .ZN(O1_T)); |
| (e) | TRB1 trb1_1(.OE(O1_OE), .I(O1_T), .(O1)); |

The description for writing each logic circuit can be varied depending on the tool and its version.

In the prior art, the RTL code is employed in consideration of the timing delay and error. Separate delay time, timing and process conditions are required in the compilation in order that the D flip-flop 40 and the three-state buffer 50 are configured to a hardware with all logic gates 10 to 50 composing the logic circuit.

If the process condition, such as width of metal line, current capacity of device and driving capability of the integrated circuit is changed, AND gates 10 and 20 and the OR gate 30 in the RTL code, which is written in a register transfer level code, must be changed.

Therefore, the RTL code has to be re-written with respect to the process condition if the existent circumstances, where hundreds of thousands of core logics are integrated, are to be taken into consideration.

Furthermore, when the VLSI having over hundreds of thousands gates is designed by the conventional register transfer level, the length of the RTL code is exceedingly increase so that a lot of time is required to change the process conditions being in the TRL code and, when a certain error is found and th n corrected, it is difficult that a programmer recognizes the error.

SUMMARY OF THE INVENTION

It is, therefore, an object of the present invention to provide a method for generating a register transfer level code.

In accordance with an aspect of the present invention, there is provided a method for generating a register transfer level code, comprising the steps of: generating the generalized register transfer level code without considering the process conditions; separating all logic gates into either a combinational logic circuit or a sequential logic circuit; transforming the register transfer level code of the separated combinational logic circuits and sequential logic circuits into each equivalent register transfer level code; and simplifying the combinational logic circuits and the sequential logic circuits into one simple code.

In accordance with another aspect of the present invention, there is provided a storage media for executing a method for generating a register transfer level code, comprising instructions performing the steps of: generalizing each register transfer level code of a combinational logic circuit and a sequential logic circuit; separating the register transfer level codes of the generalized combinational logic circuit and the sequential logic circuit; transforming the register transfer level code of the separated combinational logic circuits and sequential logic circuits into each equivalent register transfer level code; and simplifying the combinational logic circuits and the sequential logic circuits into one simple code.

In accordance with still another aspect of the present invention, there is provided a storage media for executing a method for generating a register transfer level code in a logic circuit having a three-state buffer, comprising instructions performing the steps of: generating the generalized register transfer level code without considering the process conditions; separating all logic gates into either a combinational logic circuit or a sequential logic circuit; transforming the register transfer level code of the separated combinational logic circuits and sequential logic circuits into each equivalent register transfer level code; and simplifying the combinational logic circuits and the sequential logic circuits into one simple code.

BRIEF DESCRIPTION OF THE DRAWINGS

The above and other objects and features of the present invention will become apparent from the following description of the preferred embodiments taken in conjunction with the accompanying drawings, in which:

FIGS. 4B through 4G are diagrams of methods for generating the RTL code in FIG. 4A in accordance with the present invention.

DETAILED DESCRIPTION OF THE PREFERRED EMBODIMENTS

Hereinafter, a method for generating the RTL code according to the present invention will be described in detail with reference to the accompanying drawings.

Figure 1:
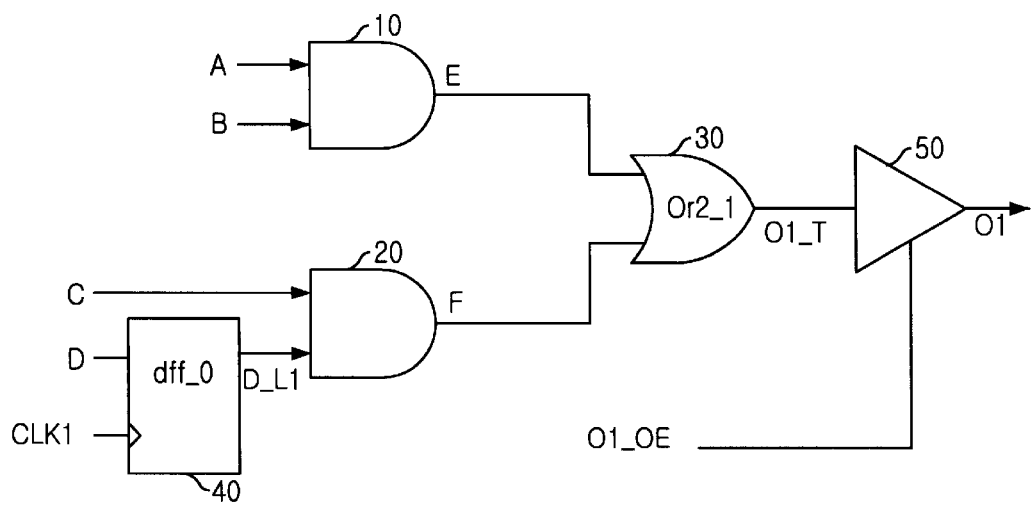
FIG. 1 is a general circuit diagram of a method for generating an ordinary RTL code in accordance with the present invention.
Figure 2:
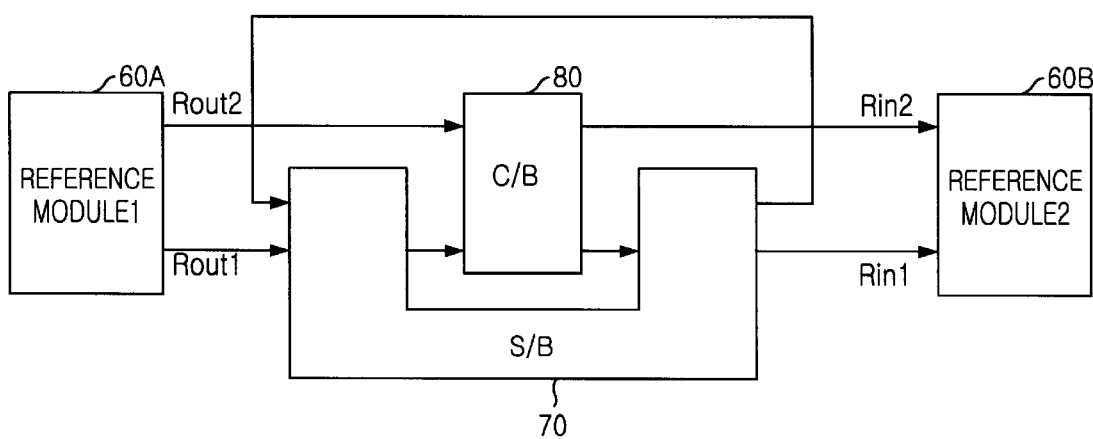
FIG. 2 is a logic block diagram describing the present invention.

FIG. 2 is a logic block diagram for describing the present invention.

In FIG. 2, block C/B stands for a combinational circuit and block S/B stands for a sequential circuit block. All blocks in FIG. 2 can be simplified into either the combination circuit block C/B or the sequential circuit block S/B.

As shown in FIG. 2, an output signal Rout2 from a first reference module 60A and an output signal from the sequential circuit block 70 can be input signals to the combinational circuit block 80. Also, an input signal Rin2 to a second reference module 60B can be an output signal from the combinational circuit block 80. Also, an output signal Rout1 from the first reference module 60A, the output signal from the combinational circuit block 80 and the output signal from the sequential circuit block 70 can be an input signal to the sequential circuit block 70. Also, the input signal to the combinational circuit block 80, the input signal to the sequential circuit block 70 and an input signal Rin1 to the first reference module 60A can be the output signal from the sequential circuit block 70.

Figure 3:
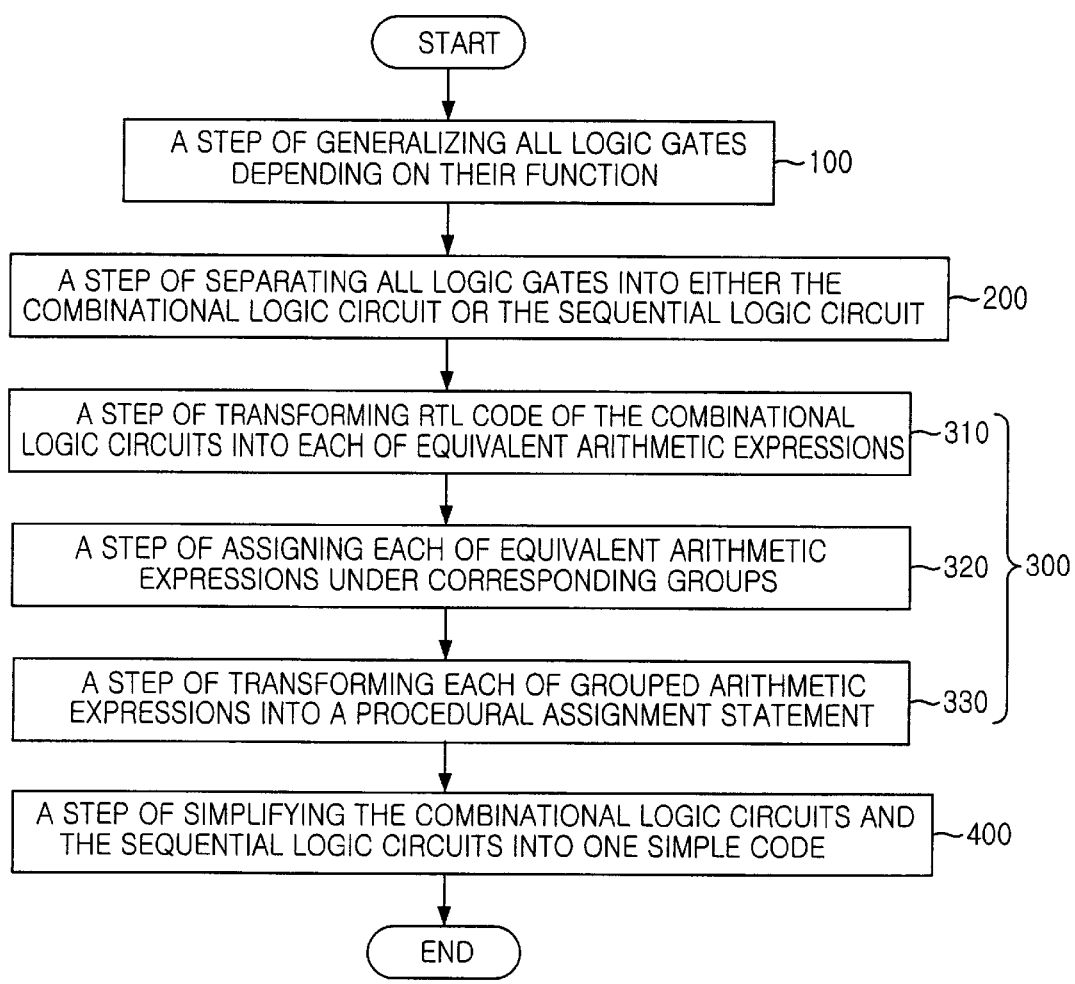
FIG. 3 is a flow chart of a method for generating a RTL in accordance with the present invention.

FIG. 3 is a flow chart of a method for generating a code of a register transfer level in accordance with the present invention.

In FIG. 3, the flow chart includes: a step of generalizing all logic gates depending on their function 100; a step of separating all logic gates into either the combinational logic circuit or the sequential logic circuit 200; a step of transforming the register transfer level code of the separated combinational logic circuits and sequential logic circuits into each equivalent register transfer level code 300; and a step of simplifying the combinational logic circuits and the sequential logic circuits into one simple code 400.

The step of transforming the register transfer level code of the separated combinational logic circuits and sequential logic circuits into each equivalent register transfer level code 300 includes: a step of transforming RTL code of the combinational logic circuits and the sequential logic circuits into each of equivalent arithmetic expressions 310; a step of assigning each of equivalent arithmetic expressions under corresponding groups 320; and a step of transforming each of grouped arithmetic expressions into a procedural assignment statement 330.

Figure 4A:
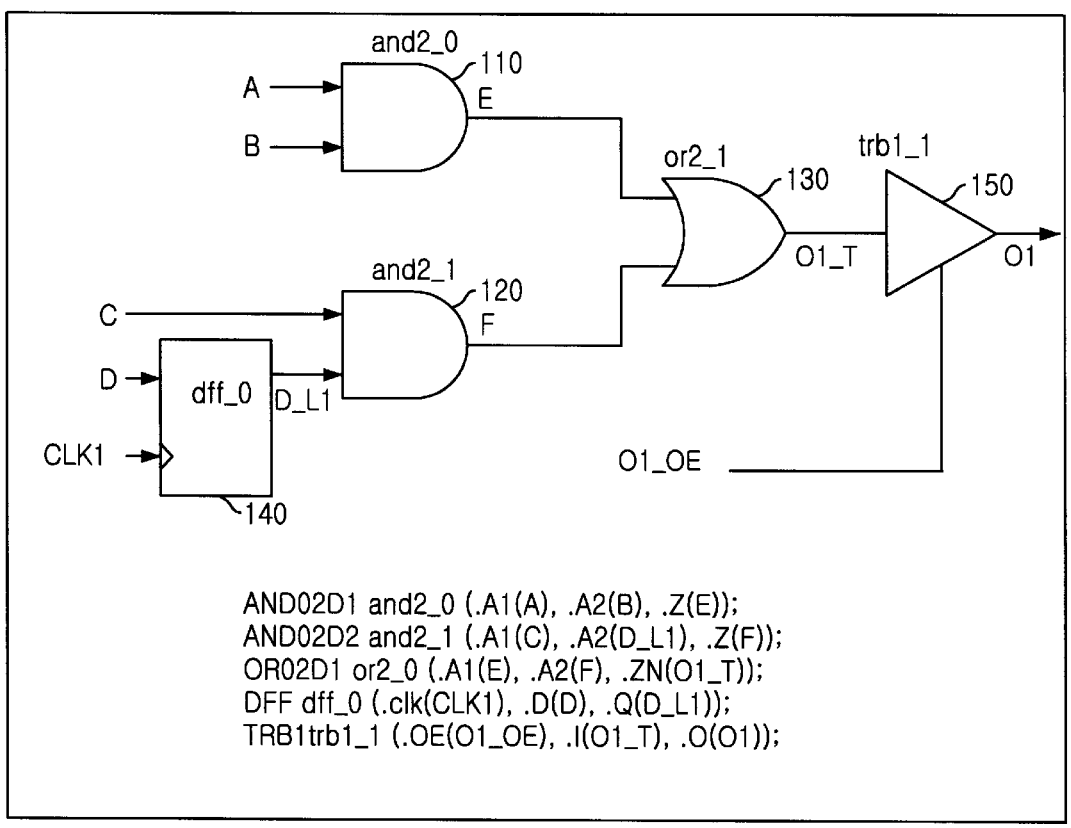
FIG. 4A is a general circuit diagram and its RTL code in accordance with the present invention.

FIG. 4A is a general circuit diagram and its RTL code in accordance with the present invention. However, the detailed description of the diagram is shown in FIG. 4B through FIG. 4G. FIGS. 4B through 4G are diagrams of methods for generating RTL code in FIG. 4A in accordance with the present invention.

Referring to FIG. 4B, input and output signals of all logic gates shown in FIG. 4A are generalized, which means they do not include a process condition.

Meanwhile, a D flip-flop 140 and a three-state buffer 150 are identical to the prior art. However, AND gates 110, 120 and an OR gate 130 are generalized. That is, the AND gate 110 is written as "AND02 and2_0 (.I1(A), .I2(B), .O1(E));", the AND gate 120 is written as "AND02 and2_1 (.I1(C), .I2(D_L1), .O1(F));" and the OR gate 130 is written as "OR02 or 2_0(.I1(E), .I2(F), O.1(O1_T));".

In the present invention, the AND gate 110 is expressed as an AND gate AND02 having only two input terminals rather than as the AND gate AND02D1, where D1 means a process condition such as width of metal line, current capacity of device and driving capability as in the prior art.

Furthermore, input terminals are expressed as ".I1" and ".I2" and an output terminal is expressed as ".O1".

Referring to FIG. 4C, combinational logic gates 110, 120, 130 and sequential logic gates 140, 150 are distinguished and grouped into either a sequential logic circuit or a combinational logic circuit.

Actually, a plurality of three-state buffers are included in most VLSI devices. In the present invention, the three-state buffer is mapped into the sequential logic circuit so that all VLSI devices can be mapped into either the sequential logic circuit or the combinational logic circuit.

Referring to FIG. 4D, each of combinational logic gates 110, 120, 130 is transformed into each of equivalent arithmetic expressions.

The generalized AND gate 110 is expressed as "assign E=A&B;", the generalized AND gate 120 is expressed as "assign F=C&D_L1;" and the generalized OR gate 130 is expressed as "assign O1_T=E|F;". That is, the generalized AND gate 110 receives and performs an AND operation on signals A and B to generate an output signal E. The generalized AND gate 120 receives and performs an AND operation on signals C and D_L1 to generate an output signal F. The generalized OR gate 130 receives and performs an OR operation on signals E and F in order to generate an output signal O1_T.

Referring to FIG. 4E and FIG. 4F, each of combinational logic gates 110, 120, 130 is expressed as an arithmetic expression depending on their inputs and outputs and becomes a combinational logic circuit. A step of transforming RTL code of the combinational logic circuits and sequential logic circuits into each of equivalent arithmetic expression 310 and a step of transforming each of grouped arithmetic expressions into a procedural assignment statement 330 are described in FIG. 4E and FIG. 4F.

Referring to FIG. 4E, each of the output signals E, F and O1_T is substituted into the arithmetic expressions until the final output signal becomes O1_T and the input signals become A, B, C and D_L1. That is, the output signals of the AND gate 110 are expressed as "A&B" and the output signals of the AND gate 120 are expressed as "C&D_1". The OR gate 130 performs an OR operation on the output signals of the AND gates 110 and 120. Therefore, the output signal of the OR gate 130 can be expressed as "O1_T=(A&B)|(C&D_L1)".

Therefore, the RTL code of the combinational logic gates 110, 120 130 is simplified into one simple RTL code, enhancing the recognition of the RTL code.

Referring to FIG. 4F, the RTL code of the sequential logic gates 140, 150 is transformed into the procedural assignment statement to enhance the recognition of the RTL code. That is, the D flip-flop 140 is expressed as "DFF dff_0(clk (CLK1), .D(D), .Q(D_L1));" in the prior art, but the D flip-flop 140 of the present invention is expressed as "always (posedge CLK1) if(CLK1)D_L1<=D".

In the expression "always(posedge CLK1) if(CLK1)D_L1<=D", an input "D" is outputted as "D_L1" when CLK1 is a positive edge.

Referring to FIG. 4G, each arithmetic expression of the combinational logic gate and the sequential logic gate is grouped into one and stored. The RTL code in FIG. 4G does not include any conditions, such as width of metal line, current capacity of device and driving capability, and the recognition of the RTL code is improved compared to the prior art.

In the prior art, when the process conditions are changed, the time is wasted because of the core logic. However, the present invention is not affected by the process conditions.

In the present invention, the RTL code is not affected by the process conditions and the length of the RTL code is shorter than the prior art so that the recognition of the RTL code is extremely superior.

The method for generating the RTL code in accordance with the present invention refers to a Verilog/XL reference manual, Cadence Design System. However, this reference is just one example. The present invention is not limited to this reference and may be applied to other VLSI tools.

While the present invention has been described with respect to the particular embodiments, it will be apparent to those skilled in the art that various changes and modifications may be made without departing from the spirit and scope of the invention as defined in the following claims.

What is claimed is:

1. A method for generating a register transfer level code, comprising steps of:
    a) generating the generalized register transfer level code without considering process conditions;
    b) separating all logic gates into combinational logic circuit and sequential logic circuits;
    c) transforming the register transfer level code of the separated combinational logic circuits and sequential logic circuits into each equivalent register transfer level code; and
    d) simplifying the combinational logic circuits and the sequential logic circuits into one simple code.

2. The method as recited in claim 1, wherein the step c) includes steps of:
    a) transforming the register transfer level code of the combinational logic circuits and the sequential logic circuits into each of equivalent logics;
    b) transforming the register transfer level code of the generalized combinational logic circuits and the generalized sequential logic circuits into each of equivalent arithmetic expressions;
    c) assigning each of equivalent arithmetic expressions under corresponding groups; and
    d) transforming each of grouped arithmetic expressions into a procedural assignment statement.

3. The method as recited in claim 1, wherein the step a) unifies a logic unit having an identical logic function and unit of inputs and outputs to the combinational logic circuits.

4. A method for generating the register transfer level code including a three-state buffer, comprising steps of:
    a) generating a generalized register transfer level code without considering process conditions;
    b) separating all logic gates into combinational logic circuit and sequential logic circuits and including the three-state buffer into the sequential logic circuit;
    c) transforming the register transfer level code of the separated combinational logic circuits and sequential logic circuits into each equivalent register transfer level code;
    d) simplifying the combinational logic circuits and the sequential logic circuits into one simple code.

5. The method as recited in claim 4, wherein the step c) includes steps of:
    a) transforming the register transfer level code of the generalized combinational logic circuits and the generalized sequential logic circuits having the three-state buffer into each of equivalent arithmetic expressions;
    b) assigning each of equivalent arithmetic expressions under corresponding groups; and
    c) transforming each of grouped arithmetic expressions into a procedural assignment statement.

6. The method as recited in claim 4, wherein the step a) unifies a logic unit having an identical logic function and unit of inputs and outputs to the combinational logic circuits.

7. A storage media for executing a method for generating a register transfer level code, comprising instructions performing steps of:
    a) generalizing each register transfer level code of a combinational logic circuit and sequential logic circuit without considering process conditions;
    b) separating the register transfer level codes of the generalized combinational logic circuit and the sequential logic circuit;
    c) transforming the register transfer level code of the separated combinational logic circuits and sequential logic circuits into each equivalent register transfer level code; and
    d) simplifying the combinational logic circuits and the sequential logic circuits into one simple code.

8. A storage media for executing a method for generating a register transfer level code in a logic circuit having a three-state buffer, comprising instructions performing steps of:
    a) generating the generalized register transfer level code without considering process conditions;
    b) separating all logic gates into combinational logic circuit and sequential logic circuits;
    c) transforming the register transfer level code of the separated combinational logic circuits and sequential logic circuits into each equivalent register transfer level code; and
    d) simplifying the combinational logic circuits and the sequential logic circuits into one simple code.

* * * * *